US012051701B2

(12) United States Patent
Willard

(10) Patent No.: US 12,051,701 B2
(45) Date of Patent: *Jul. 30, 2024

(54) DISTRIBUTED FET BACK-BIAS NETWORK

(71) Applicant: pSemi Corporation, San Diego, CA (US)

(72) Inventor: Simon Edward Willard, Irvine, CA (US)

(73) Assignee: pSemi Corporation, San Diego, CA (US)

( * ) Notice: Subject to any disclaimer, the term of this patent is extended or adjusted under 35 U.S.C. 154(b) by 39 days.

This patent is subject to a terminal disclaimer.

(21) Appl. No.: 17/844,590

(22) Filed: Jun. 20, 2022

(65) Prior Publication Data

US 2022/0367522 A1  Nov. 17, 2022

Related U.S. Application Data

(63) Continuation of application No. 16/441,623, filed on Jun. 14, 2019, now Pat. No. 11,374,022.

(51) Int. Cl.
*H01L 27/12* (2006.01)
*H01L 23/02* (2006.01)
*H03K 17/687* (2006.01)

(52) U.S. Cl.
CPC .......... *H01L 27/1203* (2013.01); *H01L 23/02* (2013.01); *H03K 17/6871* (2013.01)

(58) Field of Classification Search
None
See application file for complete search history.

(56) References Cited

U.S. PATENT DOCUMENTS

| 7,772,648 | B1 | 8/2010 | Ivanov et al. |
| 8,076,750 | B1 | 12/2011 | Kerr et al. |
| 9,837,412 | B2 | 12/2017 | Tasbas et al. |
| 9,960,098 | B2 | 5/2018 | Olson |
| 10,276,371 | B2 | 4/2019 | Englekirk et al. |
| 11,374,022 | B2 * | 6/2022 | Willard ................... H01L 23/02 |
| 2002/0180041 | A1 | 12/2002 | Sahara |

(Continued)

OTHER PUBLICATIONS

Hash, et al., "Method and Apparatus for Reducing Noise on Integrated Circuit using Broken Die Seal", patent application filed in the USPTO on Jan. 18, 2019, U.S. Appl. No. 16/252,396, 38 pgs.

(Continued)

*Primary Examiner* — Hung K Vu
(74) *Attorney, Agent, or Firm* — JAQUEZ LAND GREENHAUS & McFARLAND LLP; John Land, Esq.

(57) ABSTRACT

Electronic circuits and methods encompassing an RF switch comprising a plurality of series-coupled (stacked) integrated circuit (IC) SOI MOSFETs having a distributed back-bias network structure comprising groups of substrate contacts coupled to a bias voltage source through a resistive ladder. The distributed back-bias network structure sets the common IC substrate voltage at a fixed DC bias but resistively decouples groups of MOSFETs with respect to RF voltages so that the voltage division characteristics of the MOSFET stack are maintained. The distributed back-bias network structure increases the voltage handling capability of each MOSFET and improves the maximum RF voltage at which a particular MOSFET is effective as a switch device, while mitigating loss, leakage, crosstalk, and distortion. RF switches in accordance with the present invention are particularly useful as antenna switches.

7 Claims, 8 Drawing Sheets

(56) References Cited

U.S. PATENT DOCUMENTS

| | | | |
|---|---|---|---|
| 2011/0221510 A1* | 9/2011 | Botula | .............. H01L 21/76251 |
| | | | 257/E21.409 |
| 2012/0007654 A1 | 1/2012 | Lam | |
| 2012/0104496 A1 | 5/2012 | Botula et al. | |
| 2012/0313173 A1 | 12/2012 | Dickey et al. | |
| 2013/0278317 A1 | 10/2013 | Iversen et al. | |
| 2016/0336344 A1 | 11/2016 | Mason et al. | |
| 2016/0336990 A1* | 11/2016 | Petzold | .............. H01L 21/76895 |
| 2018/0053785 A1* | 2/2018 | Cai | .......................... H01L 21/84 |
| 2018/0337146 A1 | 11/2018 | Englekirk et al. | |
| 2020/0395383 A1 | 12/2020 | Willard | |

OTHER PUBLICATIONS

Meulemans, Bart, International Search Report and Written Opinion received from the EPO dated Sep. 3, 2020 for appln. No. PCT/US2020/037241, 13 pgs.

Meulemans, Bart, Written Opinion received from the EPO dated Apr. 15, 2021 for appln. No. PCT/US2020/037241, 9 pgs.

Aviles, Parrales O., Notification Concerning Informal Communications with the Applicant received from the EPO dated Jul. 5, 2021 for appln. No. PCT/US2020/037241, 4 pgs.

Meulemans, Bart., International Preliminary Report on Patentability received from the EPO dated Sep. 1, 2021 for appln. No. PCT/US2020/037241, 19 pgs.

Vu, Hung K., Office Action received from the USPTO dated Dec. 9, 2020 for U.S. Appl. No. 16/441,623, 6 pgs.

Vu, Hung K., Office Action received from the USPTO dated May 13, 2021 for U.S. Appl. No. 16/441,623, 23 pgs.

Vu, Hung K., Final Office Action received from the USPTO dated Nov. 10, 2021 for U.S. Appl. No. 16/441,623, 19 pgs.

Vu, Hung K., Advisory Action received from the USPTO dated Feb. 17, 2022 for U.S. Appl. No. 16/441,623, 4 pgs.

Vu, Hung K., Notice of Allowance received from the USPTO dated Mar. 7, 2022 for U.S. Appl. No. 16/441,623, 10 pgs.

\* cited by examiner

DISTRIBUTED FET BACK-BIAS NETWORK

CROSS-REFERENCE TO RELATED APPLICATIONS

The present continuation application claims priority to the following patent application, assigned to the assignee of the present invention, the contents of which are incorporated by reference: U.S. patent application Ser. No. 16/441,623, filed Jun. 14, 2019, entitled "Distributed FET Back-Bias Network", to issue on Jun. 28, 2022 as U.S. Pat. No. 11,374,022.

BACKGROUND

(1) Technical Field

The invention relates to electronic circuits, and more particularly to systems and methods for back-biasing field effect transistors used in radio frequency electronic switch circuits.

(2) Background

Radio frequency (RF) communications systems, such as cellular phones and WiFi and Bluetooth connected devices, have become the backbone of modern life. Demand for such communications systems has forced more users into crowded frequency spectrum, thereby increasing interference between all the signals. In response, system designers and regulators have increased the number of frequency bands and the density of users within bands. As a result, communications systems have become more complex and sophisticated to overcome such problems as increasing interference between signals.

Numerous system-wide approaches have been used to increase total bandwidth and data transfer rates in RF communications systems, and in cellular systems these are generally known as generations (e.g., 3G, 4G). Each generation has required increasing levels of complexity, bandwidth, and linearity, a trend expected to continue. For example, the next generation cellular system, 5G, is the most sophisticated and complex cellular system to date and will introduce antenna arrays that can steer both transmit and receive signals toward a target receiver and away from other interferers.

For a modern cellular communication system to work properly, multiple antennae must be able to operate relatively independently and to handle substantially higher voltages than the target power of the power amplifier. Antennae are typically constrained to a small volume inside a cell phone to save space, and generally can only be located in a limited number of places. This space constraint may cause crosstalk and interference coupling that may substantially degrade data rates.

These factors are driving a need for antenna switches and tuning devices with higher levels of power handling and linearity. Antennae obviously are required to handle the transmit power set by a particular standard. However, since antennae are space and cost constrained, they are often mis-matched, which wastes power and, ironically, causes power reflections which increase the voltages they must handle. Since antenna switches are directly attached to the antennae, such switches must handle such high voltages while maintaining linearity.

In modern systems, antenna switches include multiple MOSFETs series-connected in "stacks" to withstand high-voltage RF signals by dividing the voltage across the MOS-FETs of the switch stack. For example, FIG. 1 is a schematic diagram of a prior art switch 100 comprising a stack of MOSFETs M1-Mn. The MOSFETs M1-Mn are coupled drain-to-source, and their respective gates are coupled to a control voltage Vctrl through corresponding gate resistors Rg. The MOSFETs M1-Mn comprising the switch 100 are turned ON or OFF as a group by Vctrl, and thus function as a single-pole, single-throw switch.

MOSFET switch stacks may be used in series with RF signal lines to selectively block or conduct RF signals, such as between an antenna and a transceiver circuit. MOSFET switch stacks may also be used in a shunt configuration between an RF signal and a reference potential (e.g., RF circuit ground), for example, to selectively isolate nodes of the RF signal line from significantly influencing other circuitry.

Ideally, MOSFETs should not appreciably alter or affect an RF signal. However, integrated circuit MOSFETs, particularly in an RF circuit, do not function as an ideal switch having no resistance while in a conducting (ON) state and having infinite impedance and no RF coupling when in a blocking (OFF) state. For example, a MOSFET in an ON state presents some resistance, $R_{ON}$, to a conducted signal, and in an OFF state presents a very high (but not infinite) resistance, $R_{OFF}$, to a conducted signal as well as some capacitance, $C_{OFF}$, which may be in series, shunt, or parallel to an RF signal line. In addition, integrated circuit regions forming MOSFETS and related interconnecting circuitry exhibit notable parasitic capacitances, inductances, and resistances, particularly for RF signals, that may adversely affect power handling capability and linearity, while inducing distortion, insertion loss, current leakage, etc.

For example, referring to FIG. 1, drain-gate and source-gate capacitive coupling through parasitic capacitances Cp within the MOSFETs M1-Mn ensures that an applied RF signal is divided between the gates and sources/drains of the individual MOSFETs. The gate resistors Rg block the RF signal from the control node Vctrl, enabling a DC voltage to turn the MOSFETs ON and OFF. However, the parasitic capacitances Cp disrupt voltage division along the stack, causing some MOSFETs to experience too much voltage. This degrades the power handling capability and linearity of the switch 100, which in turn may require a larger number of MOSFETs in the stack and an associated increase in the insertion loss of the switch 100.

A further issue with MOSFETs is that the voltage that a single MOSFET can withstand between drain and source without breaking down is generally limited to a few volts. While a stack of MOSFETs divides an applied drain-source such that the voltage across any one MOSFET is less than its drain-source breakdown voltage, series-coupling MOSFETs increases the $R_{ON}$ of a stack switch as a whole.

The circuit shown in FIG. 1 does not fully capture the problem of mutual interactions inherent in MOSFETs. As noted above, integrated circuit regions forming MOSFETS and related interconnecting circuitry exhibit notable parasitic capacitances, inductances, and resistances, particularly for RF signals. For example, FIG. 2A is a cross-sectional view of a typical prior art silicon-on-insulator (SOI) MOSFET 200 of a type that may be used in antenna switches. The illustrated MOSFET includes a substrate 202 on which a buried oxide (BOX) layer 204 and an active layer 206 are sequentially formed, in known fashion. The active layer 206 is typically a thin layer of suitably doped silicon (but may be of other materials known in the art) on and in which various active devices may be formed. In the illustrated example, a primary MOSFET device comprises a Gate 208 formed on an insulator 210 between a Source and a Drain. The Gate 208 defines a body 212 between the Source and Drain. As is known in the art, the substrate 202 may be formed of a number of materials, including silicon, ceramic (e.g., silicon nitride, silicon carbide), crystalline or polycrystalline material such as diamond or sapphire, or other insulating or semi-insulating material.

As is common practice known in the art (and as shown in FIG. 3A, described below), there may be a superstructure 214 of various elements, regions, and structures that may be fabricated in known fashion on, above, or even through the active layer 206 in order to implement particular functionality. For example, the superstructure 214 may include conductive interconnections from the illustrated MOSFET 100 to active and passive components (including other MOSFETs), and/or external contacts, passivation layers and regions, and protective coatings. The conductive interconnections may be, for example, copper or other suitable metal, or electrically conductive material (e.g., polysilicon).

For SOI in general, and for RF circuits in particular, the substrate 202 preferably has a high resistivity in a range of about 3,000 to about 20,000 or higher ohm-cm. High resistivity substrates are capable of reducing substrate loss when used in RF SOI IC structures. However, such substrates are highly susceptible to another phenomenon called parasitic surface conduction. The problem of parasitic surface conduction occurs because while a substrate 202 having high resistivity is capable of terminating field lines, a thin surface region of the substrate 202 can be formed into an inversion or accumulation region as charge carriers are affected by signal voltages in the active layer 206. The degree to which charge carriers in the thin surface region are displaced is directly altered by signals in the active layer 206. As a result, the capacitance between the high resistivity substrate 202 and the active layer 206, as seen by the active layer 206, depends on the voltage applied, resulting in nonlinearity and a loss of signal purity. In addition, an applied voltage can invert this interface on the side of the high resistivity substrate 202 and create a channel-like layer within the thin surface region where charge can move very easily in a lateral direction (e.g., to adjacent MOSFETs) despite the fact that the substrate 202 is highly resistive. Therefore, this effect can also lead to signal-degrading crosstalk in RF communication circuits.

Parasitic surface conduction can be substantially mitigated by forming a trap rich layer 216 on top of the substrate 202. The trap rich layer 216 is typically formed as a layer of amorphous or polycrystalline silicon on a top surface of the substrate 202, and significantly degrades the carrier lifetimes and mobility of the charge carriers in the thin top surface region of the substrate 202. The trap rich layer 216 also pins the Fermi level of the surface silicon, thereby suppressing inversion at the BOX/substrate interface. Since the carriers cannot travel far, the effective high resistance of the substrate 202 is preserved and the capacitance as seen by the active layer 206 is not as dependent upon the signals in the active layer 206. The improved RF performance of SOI IC substrates with a trap rich layer 216 is so marked that wafers having that configuration are commercially available and widely used.

Another problem of SOI MOSFETs is that a parasitic back channel FET exists relative to the body 212 of the primary MOSFET device. The structure of the parasitic back channel FET is formed by the Source, substrate 202, BOX layer 204, and Drain. The substrate 202 acts as the gate for the parasitic back channel FET (i.e., the substrate 202 under the MOSFET device acts as a secondary gate for the device as a whole). FIG. 2B is an equivalent schematic diagram of the FET structure shown in FIG. 2A, showing a parasitic back channel FET 220 coupled in parallel to a primary MOSFET 222. The parasitic back channel FET 220 adversely affects the leakage current $Id_{OFF}$ and threshold voltage $V_{TH}$ of the MOSFET 200, and also adversely affects the so-called Harmonic Knee Point (HKP) of a MOSFET. The HKP of a MOSFET is the RF power at which the MOSFET dramatically increases the distortion, or nonlinearity, of an applied RF signal. The HKP effectively represents the maximum power (or, more precisely, the maximum RF voltage) at which a particular MOSFET is effective as a switch device.

Another unwanted side effect of the parasitic back channel FET 220 is that it can be strongly influenced by electrical fields that are created by back channel charge present at or near the interface between the substrate 202 and the BOX layer 204, as well as by trapped charge within the BOX layer 204. The sources of such charge can be many, but are mainly due to the manufacturing process related to the construction of the substrate, construction of the FET devices themselves, or charging effects related to exposure of the FET devices to energetic irradiation such as high energy plasmas, x-rays, gamma rays, and/or cosmic radiation.

The adverse characteristics of a parasitic back channel FET can be mitigated by tying the substrate 200 of a MOSFET to a fixed voltage, such as circuit ground or a bias voltage, in order to change the behavior of the MOSFET. For example, applying a negative substrate voltage (a "back-bias" voltage) would raise the threshold voltage of an N-type MOSFET as well as its HKP.

In another example of the inter-relatedness of MOSFET structures, while a trap rich layer 216 mitigates one type of problem, it introduces another problem. Referring again to FIG. 1 and FIG. 2A, the BOX layer 204 dielectrically isolates all FETs M1-Mn, enabling the voltage division of the stack shown in FIG. 1. However, while the trap rich layer 216 causes the substrate 202 to function as a standard semiconductor at DC and low frequencies, the trap rich layer 216 causes the substrate 202 to function as a dielectric material at RF frequencies. Accordingly, at RF frequencies, each FET M1-Mn capacitively couples through the BOX 204 and the substrate 202 to nearby ground nodes, which represents a parasitic capacitance that alters the voltage division upon which the switch 100 relies to handle high RF voltages. As mentioned above, the trap rich layer 216 prevents the formation of a charge layer at the BOX-substrate interface that would change the coupling and induce non-linearities.

As should be evident by the above, the non-ideal characteristics inherent in an integrated circuit MOSFET pose challenges in designing transistor devices and circuits utilizing such devices so as to minimize loss, leakage, crosstalk, and distortion while enhancing linearity and voltage handling capability. It is one purpose of the present invention to provide a MOSFET-based RF switch having an increased voltage handling capability with an improved HKP for each MOSFET, while mitigating loss, leakage, crosstalk, and distortion. RF switches in accordance with the present invention are particularly useful as antenna switches.

SUMMARY

The present invention encompasses an RF switch comprising a plurality of series-coupled (stacked) integrated circuit (IC) SOI MOSFETs that having a distributed back-bias network structure comprising groups of substrate contacts coupled to a bias voltage through a resistive ladder. The distributed back-bias network structure sets the common IC substrate voltage at a fixed DC bias but resistively decouples groups of MOSFETs with respect to RF voltages so that the voltage division characteristics of the MOSFET stack are maintained. The distributed back-bias network structure increases the voltage handling capability of each MOSFET and improves the HKP of each MOSFET, while mitigating loss, leakage, crosstalk, and distortion. RF switches in accordance with the present invention are particularly useful as antenna switches.

The increased HKP of MOSFETs biased by a distributed back-bias network structure in accordance with the present invention can be used by designers in multiple ways. For example, the increased HKP characteristic will improve the linearity and power handling capability of an existing MOSFET stack size compared to a MOSFET stack lacking such a network. Alternatively, the increased HKP characteristic can be used to reduce the height of a MOSFET stack while maintaining the same linearity and power handling capability as a MOSFET stack lacking such a network.

The details of one or more embodiments of the invention are set forth in the accompanying drawings and the description below. Other features, objects, and advantages of the invention will be apparent from the description and drawings, and from the claims.

DESCRIPTION OF THE DRAWINGS

Like reference numbers and designations in the various drawings indicate like elements.

DETAILED DESCRIPTION

Figure 1:
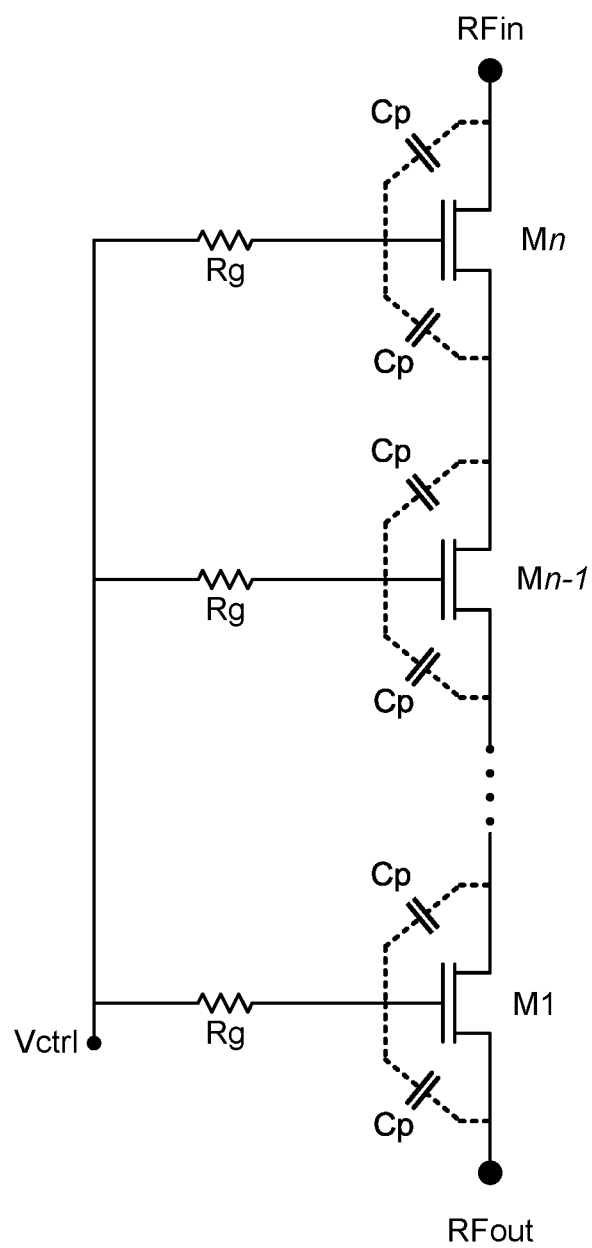
FIG. 1 is a schematic diagram of a prior art switch comprising a stack of MOSFETs M1-Mn.

The present invention encompasses an RF switch comprising a plurality of series-coupled (stacked) integrated circuit (IC) SOI MOSFETs having a distributed back-bias network structure comprising groups of substrate contacts (also called "through BOX contacts", or TBCs) coupled to a bias voltage through a resistive ladder. The distributed back-bias network structure sets the common IC substrate voltage at a fixed DC bias but resistively decouples groups of MOSFETs with respect to RF voltages so that the voltage division characteristics of the MOSFET stack are maintained. The distributed back-bias network structure increases the voltage handling capability of each MOSFET and improves the maximum RF voltage at which a particular MOSFET is effective as a switch device, while mitigating loss, leakage, crosstalk, and distortion. RF switches in accordance with the present invention are particularly useful as antenna switches.

Increasing Voltage Handling Capability & HKP

MOSFET-based switches, particularly antenna switches, are designed to operate with all MOSFETs in a stack operating below their respective HKP. By biasing the secondary gate of the back channel FET of the MOSFETs with a suitable back-bias voltage, the HKP of each MOSFET in the stack can be increased, thus increasing the voltage handling capability of the switch. (The threshold voltage would also be slightly increased, which will increase the $R_{ON}$ of the MOSFETs and somewhat increase the insertion loss of an RF switch, which in many applications is a valuable trade-off to get higher voltage handling capability). A negative DC back-bias voltage will increase the threshold voltage and voltage (RF power) handling capability of N-type MOSFETs. A positive DC back-bias voltage will increase the threshold voltage and voltage (RF power) handling capability of P-type MOSFETs.

However, as described in greater detail below, applying a back-bias voltage to an IC substrate at a single point, such as a TBC, or even through a few points, adversely affects the RF voltage division characteristics of the MOSFET stack, as well as the startup time of the switch circuit.

To overcome these problems, embodiments of the present invention apply a DC back-bias voltage through substrate contacts (S-contacts, also known as TBCs, which are used interchangeably in this disclosure) to a multitude of substrate regions of an integrated circuit proximate to a stack of MOSFETs. S-contacts are conductive structures that are formed from the superstructure of a MOSFET through the active and BOX layers to (or close to) the IC substrate. Previous uses of S-contacts have included mitigation of accumulated charge effects that adversely affect the FET, shielding, and/or for thermal conduction. Examples of applications of S-contacts by the Applicant are set forth in U.S. Pat. No. 9,837,412, issued Dec. 5, 2017, entitled "5-Contact for SOI", in U.S. Pat. No. 9,960,098, issued May 1, 2018, entitled "Systems and Methods for Thermal Conduction Using S-Contacts", and in U.S. patent application Ser. No. 15/600,588, filed May 19, 2017, entitled "Managed Substrate Effects for Stabilized SOI FETs", all of which are hereby incorporated by reference.

However, embodiments of the present invention apply S-contacts in a new configuration and circuit that includes a resistive ladder. The resulting combination of S-contacts and resistive ladders sets the common IC substrate voltage at a fixed DC bias but resistively decouples groups of MOSFETs with respect to RF voltages so that the voltage division characteristics of the MOSFET stack are preserved.

Bias Network Configuration

Figure 2A:
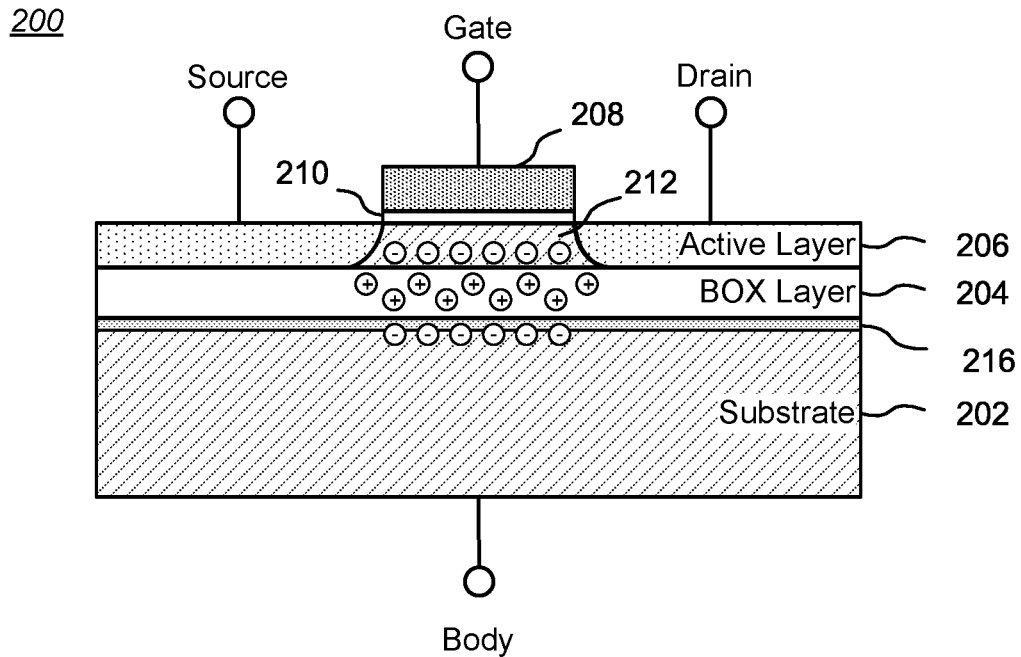
FIG. 2A is a cross-sectional view of a typical prior art silicon-on-insulator (SOI) MOSFET of a type that may be used in antenna switches.
Figure 2B:
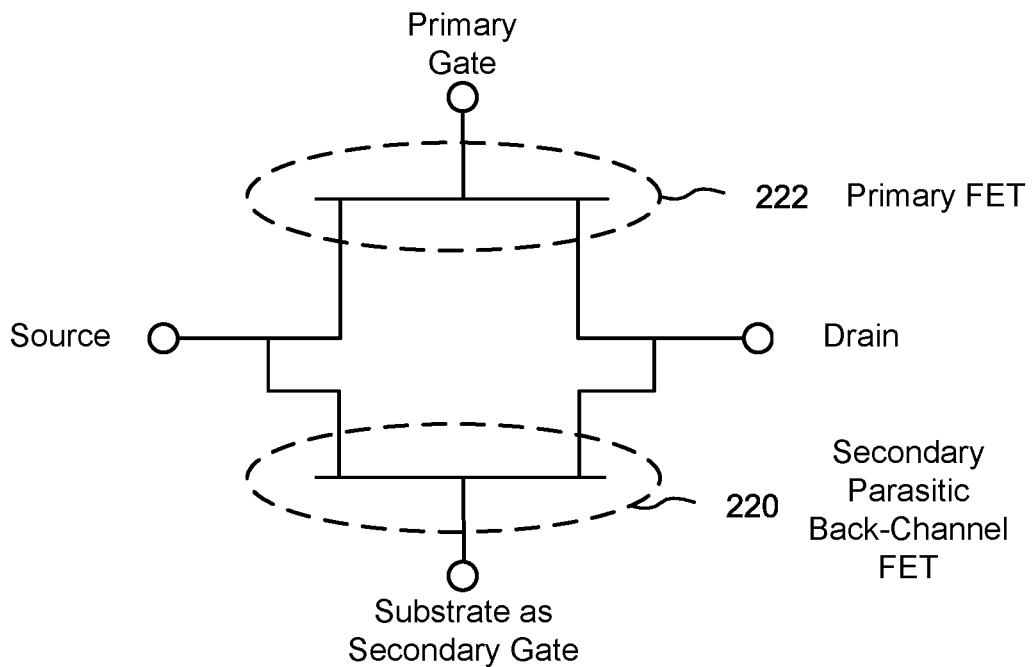
FIG. 2B is an equivalent schematic diagram of the FET structure shown in FIG. 2A, showing a parasitic back channel FET coupled in parallel to a primary MOSFET.
Figure 3A:
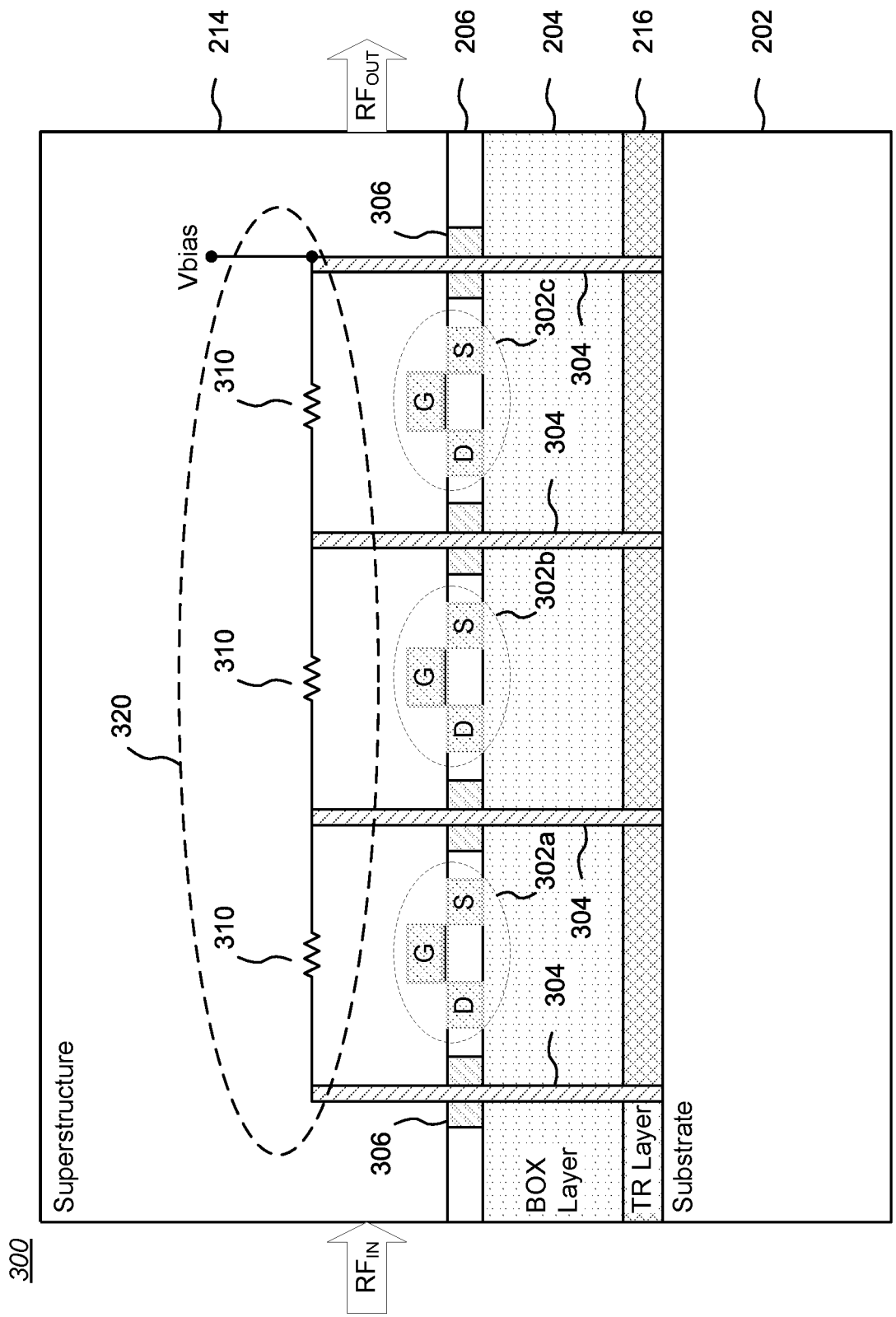
FIG. 3A is a cross-sectional view of a silicon-on-insulator (SOI) MOSFET switch that includes S-contacts as part of a distributed back-bias network structure.

FIG. 3A is a cross-sectional view of a silicon-on-insulator (SOI) MOSFET switch 300 that includes S-contacts as part of a distributed back-bias network structure. Shown in the background (along line A-A of FIG. 3B, described below) are three MOSFETs 302a-302c similar to the type shown in FIG. 2A and configured to be series-connected (e.g., source S of MOSFET 302a to drain D of MOSFET 302b, and source S of MOSFET 302b to drain D of MOSFET 302c) through the superstructure 214 (connections not shown to avoid clutter). In the illustrated example, an $RF_{IN}$ signal would be applied to the drain D of MOSFET 302a, and the source S of the MOSFET 302c would be connected as $RF_{OUT}$. Concurrent operation of all of the MOSFETs 302a-302c will either block current (OFF state) or conduct current (ON state) from $RF_{IN}$ to $RF_{OUT}$, functioning as an RF switch.

In the foreground of FIG. 3A (along line B-B of FIG. 3B, described below) are S-contacts 304 comprising conductive material formed in known manner from the superstructure 214 through the active layer 206 and the BOX layer 204 and through or into the trap rich layer 216, if present, to (or near to) the substrate 202. Each S-contact 304 penetrates through a corresponding isolation region 306 within the active layer 206. The material used for the S-contacts 304 may be any relatively low resistivity conductive material, such as polysilicon and various metals (e.g., tungsten, copper, etc.). The isolation regions 306 may be a shallow trench isolation (STI) region, particularly in the case of an SOI device, made in known manner. By virtue of penetrating through the isolation regions 306 within the active layer 206, the S-contacts 304 remain isolated from direct contact with other active regions or elements on or in the active layer 206. Note that other S-contacts (not shown) may be included and configured to perform independent functions, such as mitigation of accumulated charge effects that adversely affect the FET, shielding, and/or for thermal conduction.

Shown schematically in FIG. 3A are resistors 310 forming a resistive ladder that series-connects groups of one or more S-contacts 304 from the $RF_{IN}$ side to the $RF_{OUT}$ side of the switch 300. In some applications, a group may comprise two or more S-contacts 304 connected by a low-resistance conductor (e.g., metal) with higher resistance resistors 310 connecting the groups. The resistors 310 may be formed, for example, of polysilicon in one or more layers of the superstructure 214 or in the active layer 206, and each resistor may have the same or different resistance values. As discussed in greater detail below, the resistors 310 should have a resistance value sufficiently high so as to provide a desired level of RF isolation between the groups of S-contacts 304.

Together, the conductive groups of S-contacts 304 and the resistors 310 form a distributed back-bias network structure 320 ("Bias Network" for short). A bias voltage Vbias may be applied at one or both ends of the Bias Network 320. The bias voltage Vbias would typically be a fixed DC voltage (e.g., −3V) that would bias the substrate 202 at a fixed DC voltage level at least near the MOSFETs 302a-302c. However, in some applications, Vbias may be a variable or pulsed voltage. For example, Vbias may be negative when the MOSFETs 302a-302c are OFF (thus increasing HKP), but may be positive when the MOSFETs 302a-302c are ON to reduce ON resistance, $R_{ON}$. In some applications, since an SOI substrate 202 is highly resistive and thus can have localized potentials, selected regions of the substrate 202 (for example, under RF or analog circuits) may be biased at different DC voltages by using independent Bias Networks.

Figure 3B:
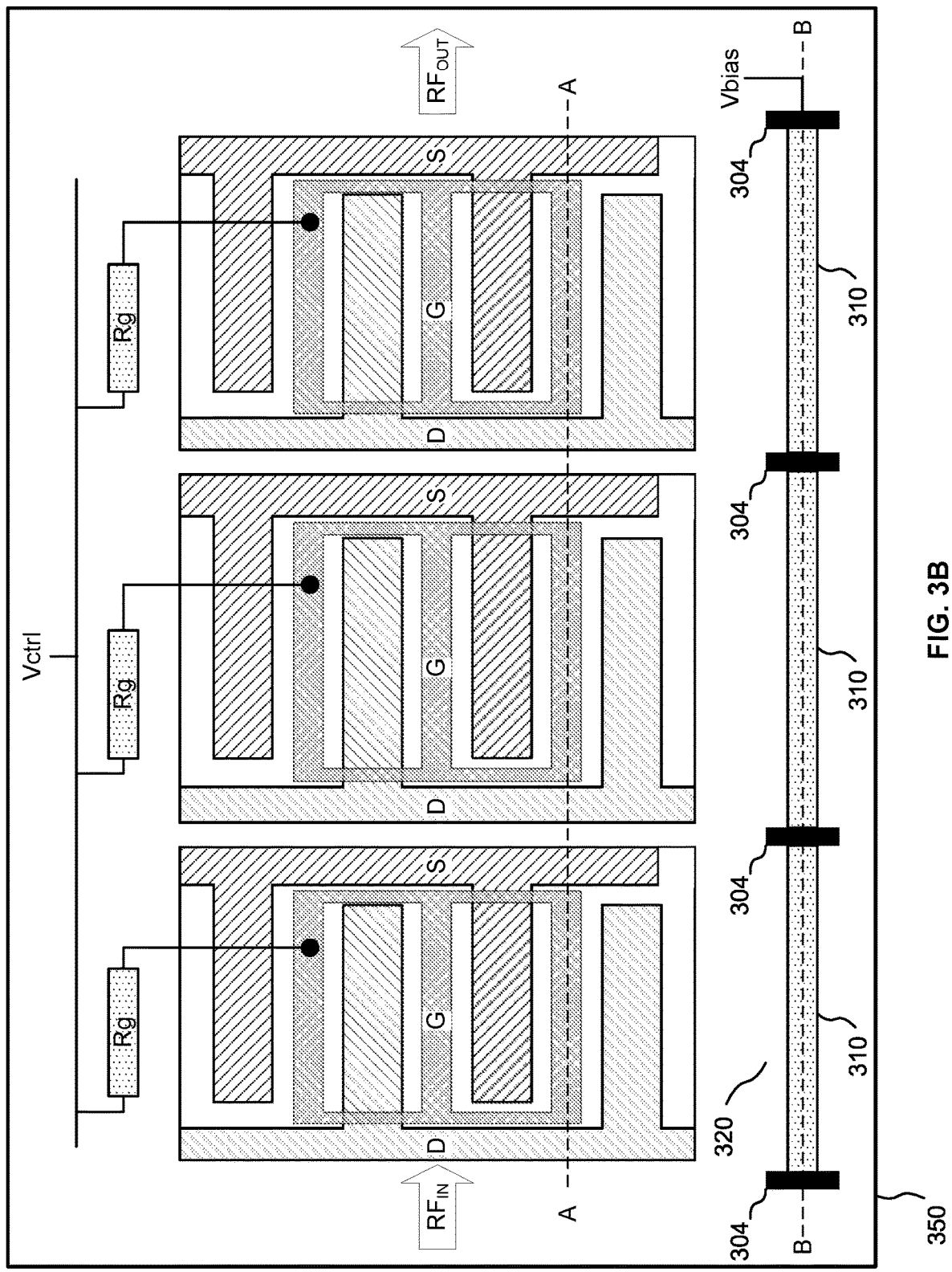
FIG. 3B is a top plan view of one section of an SOI MOSFET switch that includes S-contacts as part of a distributed back-bias network structure.

FIG. 3B is a top plan view of one section 350 of an SOI MOSFET switch that includes S-contacts as part of a distributed back-bias network structure. In this view, line A-A corresponds to the cross-sectional view of the background MOSFETs 302a-302c of FIG. 3, and line B-B corresponds to the cross-sectional view of the foreground S-contacts 304 of FIG. 3A. Three MOSFETs 302a-302c are series-connected between $RF_{IN}$ and $RF_{OUT}$ (the connections between the sources S and drains D of adjacent MOSFETs are omitted for clarity, but may be, for example, metal conductors within the superstructure 214). In the illustrated example, the gates G of the MOSFETs 302a-302c are coupled through gate resistors Rg to a control voltage Vctrl.

In the example of FIG. 3B, the Bias Network 320 of S-contacts 304 and resistors 310 is offset to a side of the MOSFETs 302a-302c and arrayed and aligned in the direction of RF signal flow through the MOSFETs 302a-302c. The S-contacts 304 have an end that is in close enough proximity (which includes actual contact) to the substrate 202 underneath the MOSFETs 302a-302c so as to impose an applied bias voltage on a region of the substrate 202 sufficient to increase the power handling capability of at least one of the MOSFETs 302a-302c. The S-contacts 304 at a second end are accessible to connections in the superstructure 204 of the integrated circuit; more particularly, pairs of groups of one or more S-contacts 304 are connected by a corresponding resistor 310. While FIGS. 3A and 3B show a relatively small number of S-contacts 304 per MOSFET 302x, it should be appreciated that the ratio of S-contacts 304 to MOSFETs 302x is a design choice.

Figure 4:
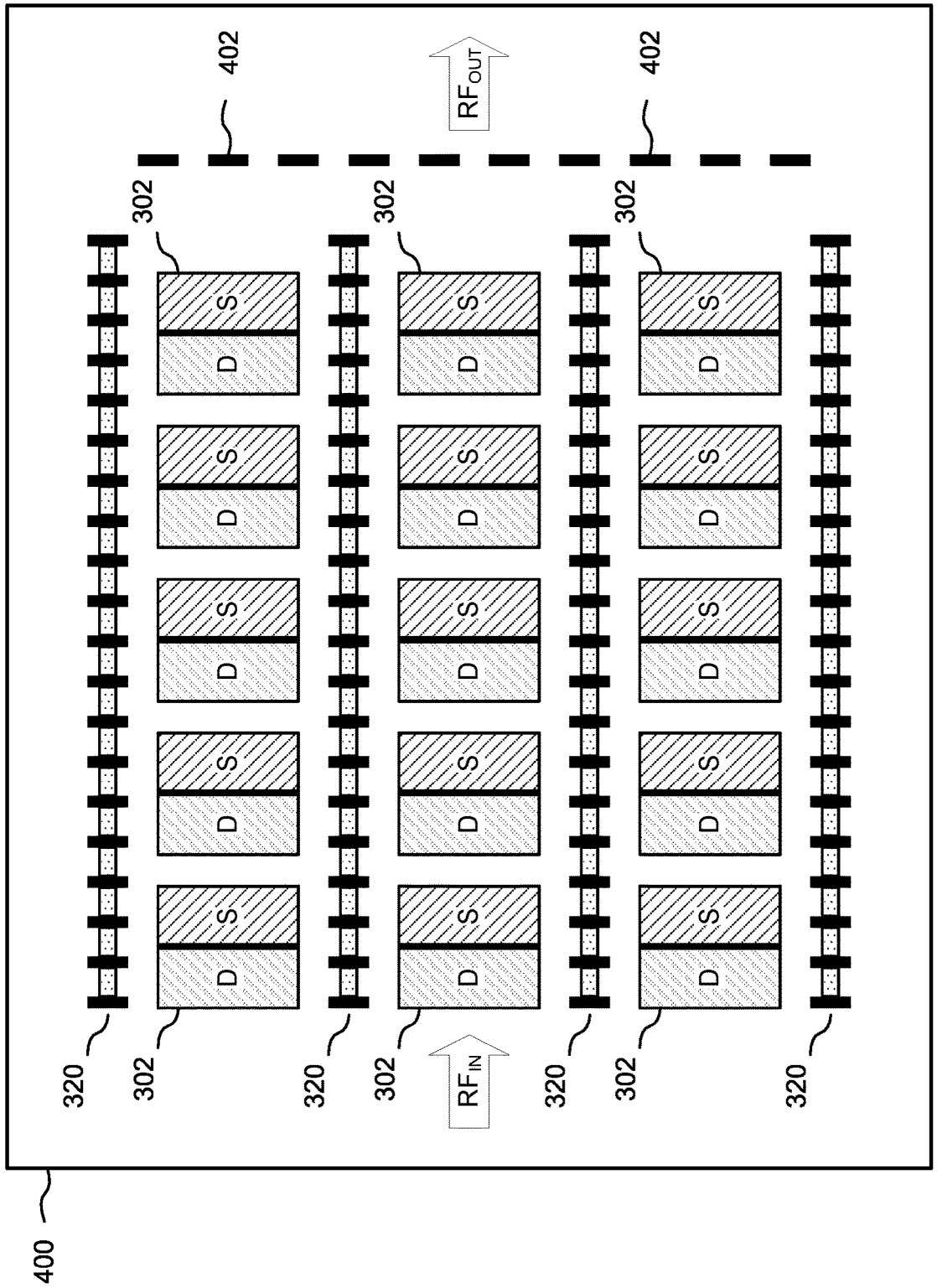
FIG. 4 is a top plan view of an SOI MOSFET switch that includes multiple stacks of MOSFETs and multiple Bias Networks.

FIG. 4 is a top plan view of an SOI MOSFET switch 400 that includes multiple stacks of MOSFETs 302 and multiple Bias Networks 320. The illustrated example shows three rows of five series-connected MOSFETs 302, with Bias Networks 320 bracketing or separating the rows of MOSFETs 302; again, the connections between the sources S and drains D of adjacent MOSFETs 302 are omitted for clarity. In some applications, the number of series-connected MOSFETs 302 may exceed 30 devices, and the rows of MOSFETs 302 may be more or less than three. In some applications, some or all rows may be connected in parallel to function as a single switch with high current capacity. In some applications, some rows (or groups of rows) may be independently connected to provide multiple switch ports.

In the illustrated example, on the $RF_{OUT}$ side of the switch 400—which is at a low common voltage—one or more optional auxiliary S-contacts 402 are included as a Vbias electrical conduit to the substrate 202. While the auxiliary S-contacts 402 are shown as multiple S-contacts, a single large busbar-like structure may also be used. Since the auxiliary S-contacts 402 are not subject to any significant RF voltage gradient, they do not need to be resistively coupled to Vbias.

The effective total resistance of all of the parallel S-contacts 304, 402 to the substrate 302 may be designed to be from high to very low, for example, from many kilohms to sub-ohm levels; a typical value in one process is often at least 100 ohms. This is often a desirable characteristic since the resistances of the individual S-contacts 304, 402 may vary, for example, due to slight differences in cross-sectional areas of the etched holes in which the S-contacts 304 are formed. In contrast, the resistance of the resistors 310 can be fairly precisely set during the IC fabrication process. Thus, the resistance of the Bias Networks 320 can be determined largely by the values of the inter-group resistors 310 if a large number of S-contacts 304 are connected in parallel (by conductors or resistors). In embodiments for some particular RF applications, the inter-group resistors 310 of a resistive ladder may have a combined resistance of about 3 about 10 times the combined resistance of the S-contacts 304, 402. In one example embodiment, the inter-group resistors 310 have values in the range of about 10K ohms to 40k ohms for a switch designed for RF signals of in the range of about 0.5 GHz to about 6 GHz.

Operational Aspects of Bias Networks

As should be appreciated from the above description, applying a suitable bias voltage Vbias to the Bias Networks 320 can impose an electrical charge on the substrate 202 near the MOSFETs 302 sufficient to increase the HKP of each MOSFET 302 in the nearby stacks and accordingly increase the voltage handling capability of the switch 400. As noted above, a negative Vbias would be used for N-type MOSFETs (e.g., about −3V), while a positive Vbias would be used for P-type MOSFETs (e.g., about +3V).

A key aspect of a Bias Network 320 is that the resistors 310 placed between groups of one or more S-contacts 304 provide substantial RF isolation between the groups. RF isolation is needed because different MOSFETs 302 in a stack of MOSFETs 302 are subjected to different divided-down levels of RF voltage from $RF_{IN}$ to $RF_{OUT}$. Therefore, the substrate 202 under different MOSFETs 302 in the stack will see different levels of RF voltage. If all of the S-contacts 304 from $RF_{IN}$ to $RF_{OUT}$ were coupled to Vbias by low-resistance conductors, then while all of the back-channel gates the MOSFETs 302 would be biased at the same DC voltage, capacitively coupled RF voltages would degrade the voltage division characteristics of the MOSFETs 302. Accordingly, a significant benefit of the Bias Networks 320 as described above is that they provide a constant DC voltage under all stacked MOSFETs 302—thus increasing their respective HKPs—while reducing RF coupling among the MOSFETs 302.

By utilizing a large number of S-contacts 304, the substrate 202 will be rapidly charged on device startup to a static DC voltage. Once charged, there is no significant current flow, so existing power supplies may be utilized to provide the Vbias voltage. For example, negative voltages are used in N-type MOSFET-based RF switches to ensure that the MOSFETs stay OFF when high power RF signals are applied. These negative supplies are often generated on-chip using low-current charge pumps. A negative bias voltage Vbias may be tapped off this existing negative voltage as long as any charging current stays within the design limit of the charge pump circuitry.

The resistance values of the resistors 310 (which need not all be the same) also sets the response time of the substrate bias circuitry, which may set a maximum value on the value of the resistors 310. More specifically, the Bias Networks 320 are integral to an RC time constant substantially set by the capacitance between the FETs in the active layer 206 and the substrate 202 (including the trap rich layer 216) directly below the FETs times the resistor 310 values. In most applications, it is preferable to adjust the resistor 310 values in the Bias Networks 320 to create an optimum time constant. The optimum time constant should balance RF coupling (a longer time constant is better) against the startup time for charging the Bias Networks 320 (a shorter time constant is better). If the startup time is too long, the RF system may apply high power RF voltages before the substrate potential has reached its target value, and therefore before the improvement in MOSFET HKP (due to the back-biasing provided through the Bias Networks 320) has been achieved. Thus, an optimum time constant may be one that prevents excess RF coupling but allows an initial startup time to meet a system requirement.

Another reason to properly size the resistors 310 is to deal with RF coupling between the long MOSFET stacks and the long lines of the Bias Network 320 structures. The Bias Networks 320 typically would be connected to the bias voltage Vbias by conductive material, such as metal traces, which in turn will couple RF power emanating from the MOSFET stack. The RF power coupled into the Bias Network 320 structures would then load the RF signal as well as affect voltage division along the MOSFET stack. Such coupling to a low impedance array of Bias Networks 320 might be significant enough to undo the advantages in increased HKP due to the Bias Networks 320. Accordingly, the resistors 310 should have sufficient resistance to substantially block such RF power coupling.

Another advantage of the Bias Network 320 structure is that biasing of the substrate 202 may be accomplished entirely through contacts on the superstructure 214 side of a switch IC. Accordingly, no access to the back side of the substrate 202 is required.

In summary, aspects of the problems to be solved by embodiments of the present invention, and of the embodiments themselves, include the following:

It is beneficial to allow the electrical potential of the substrate 202 directly under a MOSFET 302 to follow the potential of the portion of the MOSFET directly above. For example, at the top of a stack of MOSFETs designed to withstand a 100V RF signal when OFF, the corresponding the substrate 202 regions should be allowed to follow ±100V.

For SOI ICs, the substrate 202 is very high resistivity. Applying or changing the bias voltage to the secondary back gate of a MOSFET involves charging up the low frequency capacitance between the substrate 202 and the MOSFET. A MOSFET stack can be quite large (e.g., 400 μm×500 μm), so the capacitance can be significant. In order to keep the RC time constant consistent with switching and start-up specifications, substrate contacts should be numerous and close to the MOSFET stack.

The substrate 202 in close proximity to or touching the S-contacts 304 of a Bias Network 320 will be at or near the potential of the S-contacts 304.

Without the presence of the S-contacts 304, the substrate 202 near where the S-contacts 304 are located would experience a substantial RF swing. S-contacts 304 shorted together and held at a DC voltage would suppress that swing, but create a strong potential gradient near and touching the S-contacts 304, with the result that the S-contacts 304 would inject carriers (electrons) into the substrate when a positive potential gradient is applied.

Independent of charge injection, nearby S-contacts 304, the substrate 202 in contact with all of the S-contacts 304, and the low-resistance conductor (e.g., metal) connected to the top of the S-contacts 304, form a capacitor with the MOSFET stack. This adds to the parasitic capacitance of the MOSFET stack, which impacts voltage division and input capacitance.

In order to mitigate charge injection and the impact of added S-contact parasitic capacitance, embodiments of the present invention connect groups of one or more S-contacts 304 with a resistive ladder comprising one or more high value series-connected resistors 310, such as is shown in the example of FIG. 3B. With high value resistors 310 between the groups of S-contacts 304, each group of S-contacts 304 is isolated enough to be able to "follow" the RF swing of the substrate 202 underneath rather than suppress it, which essentially eliminates the possibility of charge injection. Further, the parasitic impedance that the S-contacts 304 imposes on the MOSFET stack is the impedance of the parasitic capacitance from the MOSFET stack to the S-contacts 304 in series with the impedance of the resistors 310 in the connecting resistor ladder. By suitably sizing the resistors 310, mitigation of RF coupling can be balanced against specifications for startup time and switching.

A Bias Network 320 structured as described above provides a suitable back bias to a switch stack of MOS- FETs 302 sufficient to provide a significant increase in MOSFET stack HKP and hence increased switch power handling capability. Related benefits are that the linearity of the switch is increased with very small degradation in $R_{ON}$ and insertion loss (due to increased threshold voltage $V_{TH}$). Further, any impact on non-RF analog circuitry due to $V_{TH}$ shift can be eliminated or substantially mitigate in the design of the analog circuitry.

The increased HKP of MOSFETs biased by one or more Bias Networks 320 in accordance with the present invention can be used by designers in multiple ways. For example, the increased HKP characteristic will improve the linearity and power handling capability of an existing MOSFET stack size compared to a MOSFET stack lacking Bias Networks 320. Alternatively, the increased HKP characteristic may be used to reduce the height (i.e., the number of serially connected MOSFETs) of a MOSFET stack while maintaining the same linearity and power handling capability as a MOSFET stack lacking Bias Networks 320. Any tradeoff made to reduce stack height can also reduce insertion loss, making up for the slightly higher $V_{TH}$ of MOSFETs biased by a Bias Network 320.

Die Seal Combination

Figure 5:
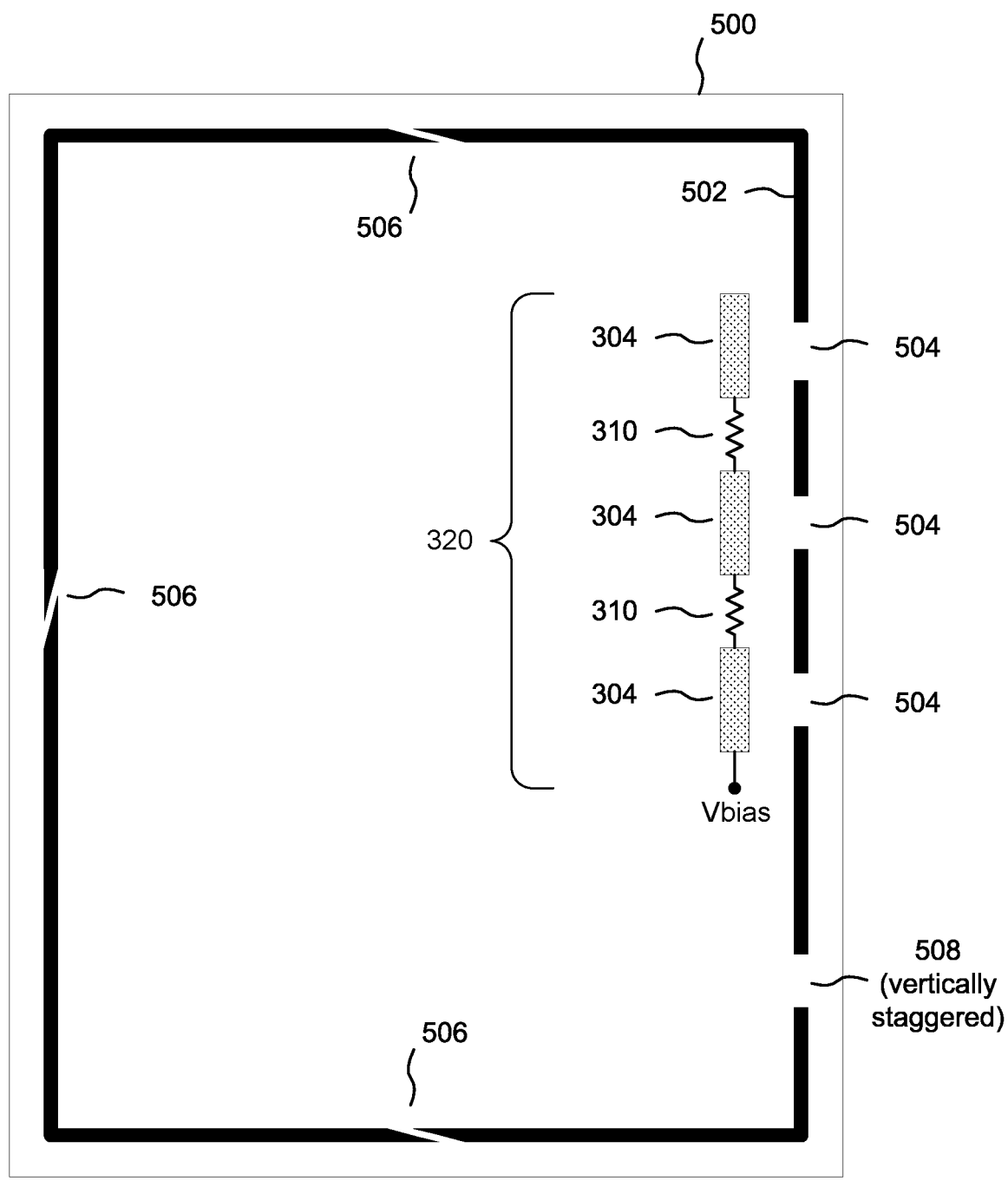
FIG. 5 is a plan view (not to scale) of an IC die having a die seal.

In the manufacture of integrated circuit (IC) dies, in many cases, it is advantageous to use die seals around the edges of individual dies (also known as "chips"). A die seal can provide protection from damage to a substrate of an IC die (and associated circuitry), and in particular protects the substrate and internal circuits of an IC die from structural stresses that occur when dicing a semiconductor wafer into IC dies. Die seals are typically formed by depositing metal lines in all metal layers around the perimeter of a die to stop propagation of die cracks and contaminants. As an example, FIG. 5 is a plan view (not to scale) of an IC die 500 having a die seal 502. Typically, most or all microelectronic circuitry is located inside the die seal 502. In some cases, S-contacts 304 (such as the S-contacts as described above with respect to FIG. 3A) are provided that electrically and mechanically connect the different metal layers of a die seal 502.

Further discussion of die seals, particularly interrupted or "broken" die seals, may be found in U.S. patent application Ser. No. 16/252,396, filed Jan. 18, 2019, entitled "Method and Apparatus for Reducing Noise on Integrated Circuit using Broken Die Seal", which is hereby incorporated by reference.

A die seal is conventionally an unbroken ring around a die, which allows induced currents to circulate around the conductive die seal. This can result in induced noise in circuits fabricated on the die, especially when the die seal is grounded, creating a path for these currents to couple into the IC circuitry. As discussed in U.S. patent application Ser. No. 16/252,396, it is known to interrupt or "break" a die seal 502 using one or more straight slots or gaps 504 for electrical isolation in order to mitigate or eliminate induced currents through the die seal 502. To ensure that cracks that might form during a cutting operation do not propagate through the straight gap 504, at least a portion of a parallel conductor strip (not shown) is provided adjacent to (meaning near but spaced from) and overlapping the straight gap 504 so that there is always a die seal segment blocking any direct path from a die edge. However, providing such a parallel conductor strip inside the die seal 502 decreases the amount of area available for fabricating circuits on the die, and providing such a parallel conductor strip outside the die seal 502 requires a larger die to accommodate the additional conductor strip. Accordingly, both of these parallel conductor strip solutions increase IC manufacturing cost.

As taught in U.S. patent application Ser. No. 16/252,396, a die seal comprising conductor strips formed on each conductor layer may be interrupted or broken in at least one place so that no current can flow around the entire perimeter of the die. In some embodiments, an angled gap 506 is provided in the original die seal, as shown in FIG. 5. In such embodiments, the multiple metal layers forming such angled gaps may be vertically aligned. In other embodiments, one or more straight (rather than angled) but vertically staggered gaps 508 may be provided. In vertically staggered straight gaps 508, the multiple metal layers forming such gaps are offset with respect to other conductive layers such that each gap in each conductor layer has at least one conductor on top and/or below it to ensure that the die seal will perform its desired protective function.

The present invention allows another approach to ensuring the presence of a die seal segment blocking any direct path from a die edge. When fabricating an IC that includes a Bias Network 320 as described above, in some applications and/or manufacturing processes, it may be desirable or necessary to utilize straight gaps 504 through the die seal 502 of the IC without vertically staggering the gaps. As described above, a Bias Network 320 includes conductive groups of S-contacts 304 and resistors 310. As shown in the example of FIG. 3A, the S-contacts 304 comprise conductive material formed from the superstructure 214 through the active layer 206 and the BOX layer 204 and through or into the trap rich layer 216, if present, to (or near to) the substrate 202. Accordingly, the S-contacts 304 exhibit essentially the same physical properties as a die seal 502 segment while being electrically isolated from the die seal 502. Thus, if a Bias Network 320 is positioned within the interior of the die seal 502 such that segments of the S-contacts 304 overlap corresponding straight gaps 504, as shown in FIG. 5, then an active die seal is preserved with respect to any direct path from a die edge without requiring a large IC die 500 or unnecessarily consuming extra IC area within the perimeter of the die seal 502. The spacing and sizes of the S-contact 304 segments can be adjusted such that they provide the dual purpose of a die seal and a distributed back-bias network structure 320 (note that the FETs associated with the Bias Network 320 are omitted from FIG. 5 to avoid clutter).

As shown in FIG. 5, combining aspects of the present invention with the teachings of U.S. patent application Ser. No. 16/252,396 allows use of both angled gaps 506 and non-staggered straight gaps 504 (i.e., without vertical staggering) through the die seal 502 of an IC die 500. In addition, other teachings of U.S. patent application Ser. No. 16/252,396 may be applied, such as including straight gaps that are vertically staggered (not shown in FIG. 5). Further, while FIG. 5 shows S-contacts 304 of a Bias Network 320 adjacent to and overlapping non-staggered straight gaps 504, such S-contacts 304 may also be formed adjacent to and overlapping angled gaps 506 and/or vertically staggered straight gaps 508.

Methods

Figure 6:
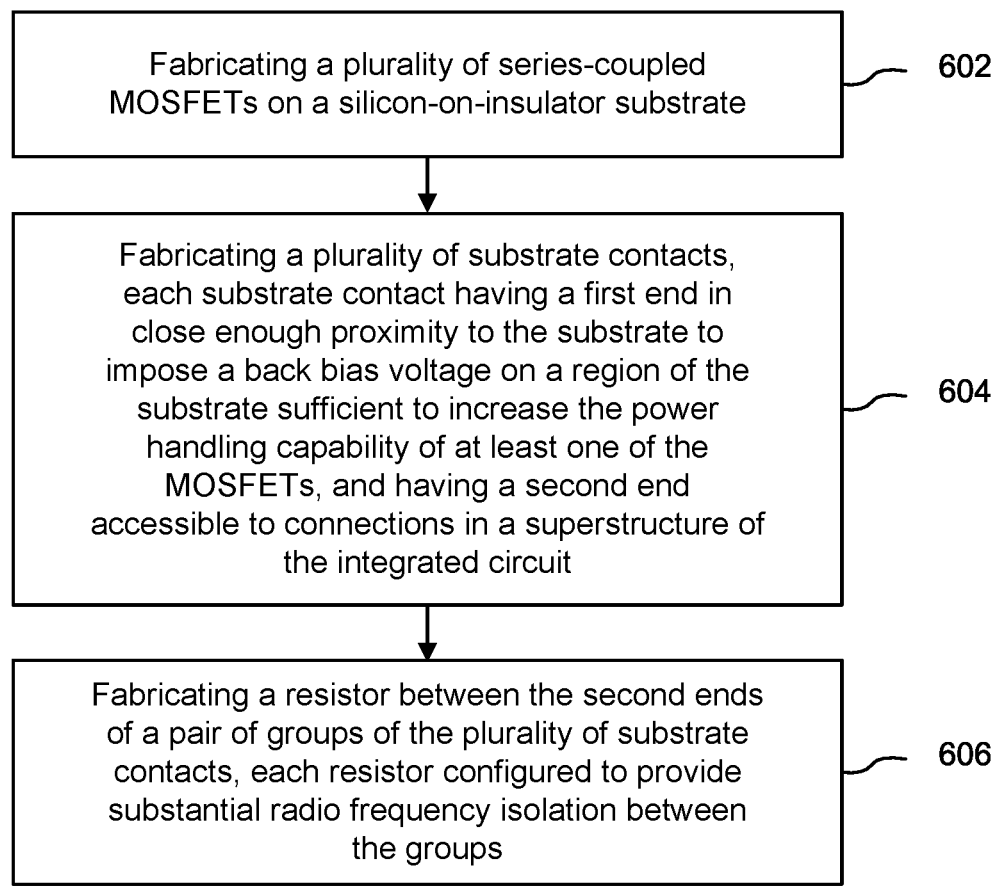
FIG. 6 is a process flow chart showing one method for fabricating an integrated circuit having increased power handling capability.

Another aspect of the invention includes methods for fabricating an integrated circuit having increased power handling capability, including an improved RF switch. For example, FIG. 6 is a process flow chart 600 showing one method for fabricating an integrated circuit having increased power handling capability. The method includes: fabricating a plurality of series-coupled MOSFETs on a silicon-on-insulator substrate (Block 602); fabricating a plurality of substrate contacts, each substrate contact having a first end in close enough proximity to the substrate to impose a back bias voltage on a region of the substrate sufficient to increase the power handling capability of at least one of the MOSFETs, and having a second end accessible to connections in a superstructure of the integrated circuit (Block 604); and fabricating a resistor between the second ends of a pair of groups of the plurality of substrate contacts, each resistor configured to provide substantial radio frequency isolation between the groups (Block 606).

Figure 7:
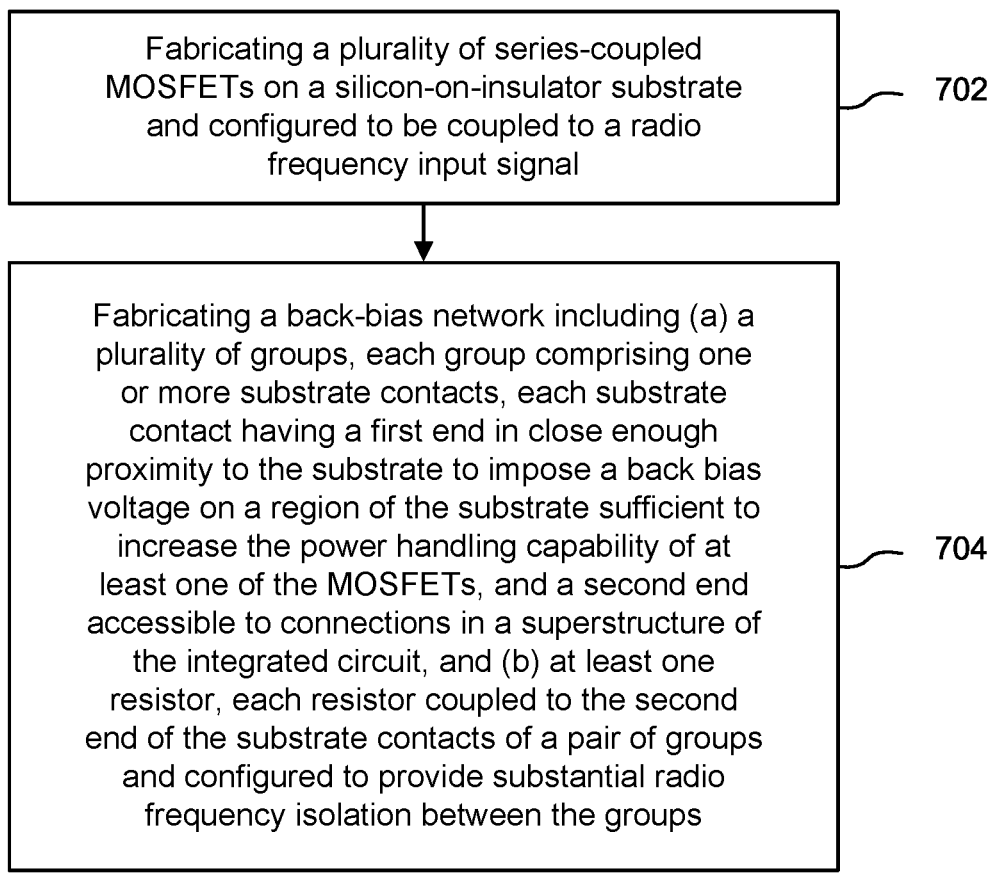
FIG. 7 is a process flow chart showing one method for fabricating a radio frequency switch.

As another example, FIG. 7 is a process flow chart 700 showing one method for fabricating a radio frequency switch. The method includes: fabricating a plurality of series-coupled MOSFETs on a silicon-on-insulator substrate and configured to be coupled to a radio frequency input signal (Block 702); and fabricating a back-bias network including (a) a plurality of groups, each group comprising one or more substrate contacts, each substrate contact having a first end in close enough proximity to the substrate to impose a back bias voltage on a region of the substrate sufficient to increase the power handling capability of at least one of the MOSFETs, and a second end accessible to connections in a superstructure of the integrated circuit, and (b) at least one resistor, each resistor coupled to the second end of the substrate contacts of a pair of groups and configured to provide substantial radio frequency isolation between the groups (Block 704).

The above methods and circuits may also include one or more of the following: wherein the MOSFETs are N-type MOSFETs and the applied bias voltage is a negative bias voltage; wherein the MOSFETs are P-type MOSFETs and the applied bias voltage is a positive bias voltage; wherein each resistor provides at least 10K ohms of resistance between the pairs of groups; further including configuring the plurality of substrate contacts into at least a first group and a second group of one or more substrate contacts, and configuring the at least first group and second group of one or more substrate contacts to selectively impose at least two different back bias voltages to corresponding different regions of the substrate; further including configuring the groups of one or more substrate contacts to selectively impose at least two different back bias voltages to corresponding different regions of the substrate; linearly arraying the plurality of series-coupled MOSFETs on the substrate, and offsetting the groups of one or more substrate contacts and the resistors to a side of the MOSFETs, and arraying and aligning the groups of one or more substrate contacts and the resistors in a direction of radio frequency signal flow through the MOSFETs; and linearly arraying the plurality of series-coupled MOSFETs on the substrate, and offsetting the back-bias network to a side of the linearly arrayed MOSFETs, and arraying and aligning the back-bias network in a direction of radio frequency signal flow through the MOSFETs.

Fabrication Technologies & Options

The term "MOSFET", as used in this disclosure, includes any field effect transistor (FET) having an insulated gate whose voltage determines the conductivity of the transistor, and encompasses insulated gates having a metal or metal-like, insulator, and/or semiconductor structure. The terms "metal" or "metal-like" include at least one electrically conductive material (such as aluminum, copper, or other metal, or highly doped polysilicon, graphene, or other electrical conductor), "insulator" includes at least one insulating material (such as silicon oxide or other dielectric material), and "semiconductor" includes at least one semiconductor material.

With respect to the figures referenced in this disclosure, note that the dimensions for the various elements are not to scale; some dimensions have been greatly exaggerated vertically and/or horizontally for clarity or emphasis. In addition, references to orientations and directions (e.g., "top", "bottom", "above", "below", "lateral", "vertical", "horizontal", etc.) are relative to the example drawings, and not necessarily absolute orientations or directions.

As used in this disclosure, the term "radio frequency" (RF) refers to a rate of oscillation in the range of about 3 kHz to about 300 GHz. This term also includes the frequencies used in wireless communication systems. An RF frequency may be the frequency of an electromagnetic wave or of an alternating voltage or current in a circuit.

Various embodiments of the invention can be implemented to meet a wide variety of specifications. Unless otherwise noted above, selection of suitable component values is a matter of design choice. Various embodiments of the invention may be implemented in any suitable integrated circuit (IC) technology (including but not limited to MOSFET structures), or in hybrid or discrete circuit forms. Integrated circuit embodiments may be fabricated using any suitable substrates and processes, including but not limited to silicon-on-insulator (SOI), or other silicon-on-semiconductor combinations. However, embodiments of the invention are particularly useful when fabricated using an SOI based process, or when fabricated with processes having similar characteristics. Fabrication in CMOS using SOI or SOS processes enables circuits with low power consumption, the ability to withstand high power signals during operation due to FET stacking, good linearity, and high frequency operation (i.e., radio frequencies up to and exceeding 50 GHz). Monolithic IC implementation is particularly useful since parasitic capacitances generally can be kept low (or at a minimum, kept uniform across all units, permitting them to be compensated) by careful design.

Voltage levels may be adjusted, and/or voltage and/or logic signal polarities reversed, depending on a particular specification and/or implementing technology (e.g., NMOS, PMOS, or CMOS, and enhancement mode or depletion mode transistor devices). Component voltage, current, and power handling capabilities may be adapted as needed, for example, by adjusting device sizes, serially "stacking" components (particularly FETs) to withstand greater voltages, and/or using multiple components in parallel to handle greater currents. Additional circuit components may be added to enhance the capabilities of the disclosed circuits and/or to provide additional functionality without significantly altering the functionality of the disclosed circuits.

CONCLUSION

A number of embodiments of the invention have been described. It is to be understood that various modifications may be made without departing from the spirit and scope of the invention. For example, some of the steps described above may be order independent, and thus can be performed in an order different from that described. Further, some of the steps described above may be optional. Various activities described with respect to the methods identified above can be executed in repetitive, serial, or parallel fashion.

It is to be understood that the foregoing description is intended to illustrate and not to limit the scope of the invention, which is defined by the scope of the following claims, and that other embodiments are within the scope of the claims. In particular, the scope of the invention includes any and all feasible combinations of one or more of the processes, machines, manufactures, or compositions of matter set forth in the claims below. (Note that the parenthetical labels for claim elements are for ease of referring to such elements, and do not in themselves indicate a particular required ordering or enumeration of elements; further, such labels may be reused in dependent claims as references to additional elements without being regarded as starting a conflicting labeling sequence).

What is claimed is:

1. A radio frequency switch comprising:
(a) a plurality of series-coupled MOSFETs fabricated as an integrated circuit on a silicon-on-insulator substrate and configured to be coupled to a radio frequency input signal;
(b) a back-bias network including:
  (1) a plurality of groups, each group comprising one or more substrate contacts, each substrate contact having a first end in close enough proximity to the substrate to impose a back bias voltage on a region of the substrate sufficient to increase the power handling capability of at least one of the MOSFETs, and a second end accessible to connections in a superstructure of the integrated circuit, wherein each substrate contact includes a conductive structure extending from the superstructure of the integrated circuit through an active layer and an insulating buried oxide layer of the integrated circuit to or near to the substrate; and
  (2) at least one resistor, each resistor coupled to the second end of the substrate contacts of a pair of groups and configured to provide substantial radio frequency isolation between the groups; and
(c) a bias voltage source coupled to at least one of the plurality of groups.

2. The radio frequency switch of claim 1, wherein the MOSFETs are N-type MOSFETs and the bias voltage source supplies a negative bias voltage to the groups of one or more substrate contacts.

3. The radio frequency switch of claim 1, wherein the MOSFETs are P-type MOSFETs and the bias voltage source supplies a positive bias voltage to the groups of one or more substrate contacts.

4. The radio frequency switch of claim 1, wherein each resistor provides at least 10K ohms of resistance.

5. The radio frequency switch of claim 1, wherein the groups of one or more substrate contacts are configured to selectively impose at least two different back bias voltages to corresponding different regions of the substrate.

6. The radio frequency switch of claim 1, wherein the plurality of series-coupled MOSFETs are linearly arrayed on the substrate, and the groups of one or more substrate contacts and the resistors are offset to a side of the MOSFETs and arrayed and aligned in a direction of radio frequency signal flow through the MOSFETs.

7. The radio frequency switch of claim 1, wherein the integrated circuit includes a die seal having at least one gap having an interior, and wherein at least one substrate contact is positioned within the interior of the die seal adjacent to and overlapping at least one gap.

* * * * *